US012787555B2

(12) United States Patent
Li

(10) Patent No.: US 12,787,555 B2
(45) Date of Patent: Nov. 3, 2026

(54) DISPLAY PANEL, MANUFACTURING METHOD, AND MOBILE TERMINAL

(71) Applicant: Shenzhen China Star Optoelectronics Semiconductor Display Technology Co., Ltd., Shenzhen (CN)

(72) Inventor: Mingming Li, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 442 days.

(21) Appl. No.: 18/491,773

(22) Filed: Oct. 22, 2023

(65) Prior Publication Data

US 2024/0155879 A1 May 9, 2024

(30) Foreign Application Priority Data

Nov. 7, 2022 (CN) ......................... 202211387347.7

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/353* (2023.02);
(Continued)

(58) Field of Classification Search
CPC ............. H10K 59/122; H10K 59/1201; H10K 59/353; H10K 59/8792; H10K 59/352;
(Continued)

(56) References Cited

U.S. PATENT DOCUMENTS

2022/0093894 A1 3/2022 Song et al.

FOREIGN PATENT DOCUMENTS

CN 114335109 A 4/2022
CN 114361226 A 4/2022
(Continued)

OTHER PUBLICATIONS

CN 114361226 A machine translation (Year: 2022).*
(Continued)

*Primary Examiner* — Anne M Hines
*Assistant Examiner* — Jose M Diaz
(74) *Attorney, Agent, or Firm* — Nathan & Associates; Menachem Nathan

(57) ABSTRACT

A display panel includes an array substrate, a pixel definition layer disposed on the array substrate, a light emitting device layer, and an auxiliary electrode. The pixel definition layer includes pixel openings and grooves. The light emitting device layer includes an anode layer disposed on the array substrate, light emitting units disposed in the pixel openings, a functional layer disposed on the light emitting units, and a cathode layer disposed on the functional layer. The auxiliary electrode corresponds to the grooves. The auxiliary electrode includes a first auxiliary layer disposed in the same layer as the anode layer, a side wall of the first auxiliary layer is spaced apart from side walls of the grooves to form a first opening, the functional layer is disconnected at the first opening, and the cathode layer covers the first opening and is electrically connected to the side wall of the first auxiliary layer.

20 Claims, 8 Drawing Sheets

(51) Int. Cl.
*H10K 59/35* (2023.01)
*H10K 59/80* (2023.01)
*H10K 71/13* (2023.01)
*H10K 71/60* (2023.01)

(52) U.S. Cl.
CPC ....... *H10K 59/8792* (2023.02); *H10K 71/135* (2023.02); *H10K 71/60* (2023.02)

(58) Field of Classification Search
CPC ......... H10K 59/1315; H10K 59/80522; H10K 71/135; H10K 71/60
See application file for complete search history.

(56) References Cited

FOREIGN PATENT DOCUMENTS

| | | | | | |
|---|---|---|---|---|---|
| CN | 115275046 A | | 11/2022 | | |
| CN | 115275047 A | * | 11/2022 | ........... | H10K 50/818 |

OTHER PUBLICATIONS

CN 115275047 A machine translation (Year: 2022).*
Chinese Office Action issued in corresponding Chinese Patent Application No. 202211387347.7 dated Dec. 3, 2025, pp. 1-7.

* cited by examiner

DISPLAY PANEL, MANUFACTURING METHOD, AND MOBILE TERMINAL

CROSS REFERENCE TO RELATED APPLICATIONS

This application claims priority to Chinese Patent Application No. 202211387347.7, filed on Nov. 7, 2022, and entitled "DISPLAY PANEL, MANUFACTURING METHOD, AND MOBILE TERMINAL". The entire disclosures of the above application are incorporated herein by reference.

TECHNICAL FIELD

The present application relates to the field of display technology, in particular to a display panel, a manufacturing method, and a mobile terminal.

BACKGROUND

OLED (organic light-emitting diode) display technology is a new type of display technology. With its unique advantages such as low power consumption, high saturation, fast response time, and wide viewing angle, OLED has gradually attracted people's attention and occupied a certain position in the field of panel display technology.

In OLED display panels, a cathode layer is provided as a whole layer and has a large resistance, causing a voltage drop. Therefore, this issue needs to be improved. In the prior art, the cathode layer is often connected in parallel with an auxiliary electrode to improve a voltage drop. However, the production of the auxiliary electrode requires the use of an additional mask. The cost of the mask is high, resulting in an increase in the cost of the product. How to improve the voltage drop of the cathode layer without adding a mask is one of the technical problems that those skilled in the art urgently need to solve.

SUMMARY

The present application provides a display panel, a manufacturing method, and a mobile terminal to improve a voltage drop of a cathode without adding a mask.

In order to solve the above issues, the technical solutions provided by the present application are as follows:

The present application provides a display panel, which includes:

- an array substrate;
- a pixel definition layer disposed on the array substrate, wherein the pixel definition layer comprises a plurality of pixel openings and a plurality of grooves;
- a light emitting device layer comprising an anode layer disposed on the array substrate, light emitting units disposed in the pixel openings, a functional layer disposed on the light emitting units, and a cathode layer disposed on the functional layer; and
- an auxiliary electrode corresponding to the grooves;
- wherein the auxiliary electrode comprises a first auxiliary layer disposed in the same layer as the anode layer, a side wall of the first auxiliary layer is spaced apart from side walls of the grooves to form a first opening, the functional layer is disconnected at the first opening, and the cathode layer covers the first opening and is electrically connected to the side wall of the first auxiliary layer.

In the display panel of the present application, the pixel definition layer comprises:

- a first pixel definition layer extending along a first direction;
- a second pixel definition layer extending along a second direction, wherein the second pixel definition layer is located on a side of the first pixel definition layer away from the array substrate;
- in a top view direction of the display panel, the pixel definition layer is arranged around sub-pixels of the display panel, the sub-pixels comprise red sub-pixels, green sub-pixels, and blue sub-pixels, the grooves are disposed in an overlapping area of the first pixel definition layer and the second pixel definition layer, and each of the grooves is disposed between the two blue sub-pixels.

In the display panel of the present application, the pixel definition layer comprises:

- a first pixel definition layer extending along a first direction;
- a second pixel definition layer extending along a second direction, wherein the second pixel definition layer is located on a side of the first pixel definition layer away from the array substrate;
- in a top view direction of the display panel, the pixel definition layer is arranged around sub-pixels of the display panel, the sub-pixels comprise red sub-pixels, green sub-pixels, and blue sub-pixels, the grooves are disposed in an overlapping area of the first pixel definition layer and the second pixel definition layer, and each of the grooves are disposed between each of the red sub-pixels and each of the green sub-pixels.

In the display panel of the present application, the first auxiliary layer comprises a first conductive layer, a second conductive layer, and a third conductive layer stacked on each other;

- wherein an end of the second conductive layer protrudes from the side wall of the first auxiliary layer, and the end of the second conductive layer is in contact with the cathode layer.

In the display panel of the present application, the end of the second conductive layer has an uneven surface, and a material of the second conductive layer comprises metallic silver.

In the display panel of the present application, the functional layer covers the cathode layer, the functional layer is interrupted at the side wall of the first auxiliary layer, and the first opening surrounds the grooves.

In the display panel of the present application, in a top view direction of the display panel, a shape of the first auxiliary layer comprises a circle or a polygon.

In the display panel of the present application, the auxiliary electrode further comprises a second auxiliary layer, the second auxiliary layer is disposed in contact with the first auxiliary layer, and the second auxiliary layer is disposed in the same layer as at least one metal layer in the array substrate.

The present application further provides a method of manufacturing the above-mentioned display panel. The manufacturing method includes:

- providing a substrate and forming a light shielding layer and a first metal part on the substrate;
- forming a buffer layer on the light shielding layer and forming a semiconductor layer on the buffer layer;
- forming a gate insulating layer on the semiconductor layer and forming a gate on the gate insulating layer;

forming an interlayer insulating layer on the gate and using a preset process to form a plurality of through holes, wherein the through holes penetrate the interlayer insulating layer and expose the light shielding layer and the first metal part;

forming a source-drain layer and a second metal part on the interlayer insulating layer, wherein the source-drain layer and the second metal part fill a plurality of the through holes;

forming a passivation layer on the source-drain layer and using the preset process to open an opening on the passivation layer corresponding to the source-drain layer and the second metal part to expose the source-drain layer and the second metal part;

forming a connection part and a third metal part in the opening on the passivation layer;

forming a planarization layer on the connection part and the third metal part and using the preset process to open an opening on the planarization layer corresponding to the connection part and the third metal part to expose the connection part and the third metal part;

forming an anode layer and a first auxiliary layer on the planarization layer;

forming a pixel definition layer on the anode layer and the first auxiliary layer, forming a plurality of pixel openings and a plurality of grooves on the pixel definition layer, forming light emitting units in the pixel openings, wherein the grooves correspond to the auxiliary electrode, and the side wall of the first auxiliary layer is spaced apart from side walls of the grooves to form a first opening;

forming a functional layer on the pixel definition layer, wherein the functional layer is disconnected at the first opening; and forming a cathode layer on the functional layer, wherein the cathode layer covers the first opening and is electrically connected to the side wall of the first auxiliary layer.

In the method of manufacturing the display panel of the present application, the method of manufacturing the display panel further comprises using inkjet printing to form the light emitting units.

This application further provides a mobile terminal including a display panel.

The display panel comprises:

an array substrate;

a pixel definition layer disposed on the array substrate, wherein the pixel definition layer comprises a plurality of pixel openings and a plurality of grooves;

a light emitting device layer comprising an anode layer disposed on the array substrate, light emitting units disposed in the pixel openings, a functional layer disposed on the light emitting units, and a cathode layer disposed on the functional layer; and an auxiliary electrode corresponding to the grooves;

wherein the auxiliary electrode comprises a first auxiliary layer disposed in the same layer as the anode layer, a side wall of the first auxiliary layer is spaced apart from side walls of the grooves to form a first opening, the functional layer is disconnected at the first opening, and the cathode layer covers the first opening and is electrically connected to the side wall of the first auxiliary layer.

In the mobile terminal of the present application, the pixel definition layer comprises:

a first pixel definition layer extending along a first direction;

a second pixel definition layer extending along a second direction, wherein the second pixel definition layer is located on a side of the first pixel definition layer away from the array substrate;

in a top view direction of the display panel, the pixel definition layer is arranged around sub-pixels of the display panel, the sub-pixels comprise red sub-pixels, green sub-pixels, and blue sub-pixels, the grooves are disposed in an overlapping area of the first pixel definition layer and the second pixel definition layer, and each of the grooves is disposed between the two blue sub-pixels.

In the mobile terminal of the present application, the pixel definition layer comprises:

a first pixel definition layer extending along a first direction;

a second pixel definition layer extending along a second direction, wherein the second pixel definition layer is located on a side of the first pixel definition layer away from the array substrate;

in a top view direction of the display panel, the pixel definition layer is arranged around sub-pixels of the display panel, the sub-pixels comprise red sub-pixels, green sub-pixels, and blue sub-pixels, the grooves are disposed in an overlapping area of the first pixel definition layer and the second pixel definition layer, and each of the grooves are disposed between each of the red sub-pixels and each of the green sub-pixels.

In the mobile terminal of the present application, a light emitting area of the blue sub-pixels is greater than a light emitting area of the red sub-pixels.

In the mobile terminal of the present application, a light emitting area of the blue sub-pixels is greater than a light emitting area of the green sub-pixels.

In the mobile terminal of the present application, the first auxiliary layer comprises a first conductive layer, a second conductive layer, and a third conductive layer stacked on each other;

wherein an end of the second conductive layer protrudes from the side wall of the first auxiliary layer, and the end of the second conductive layer is in contact with the cathode layer.

In the mobile terminal of the present application, the end of the second conductive layer has an uneven surface, and a material of the second conductive layer comprises metallic silver.

In the mobile terminal of the present application, the functional layer covers the cathode layer, the functional layer is interrupted at the side wall of the first auxiliary layer, and the first opening surrounds the grooves.

In the mobile terminal of the present application, in a top view direction of the display panel, a shape of the first auxiliary layer comprises a circle or a polygon.

In the mobile terminal of the present application, the auxiliary electrode further comprises a second auxiliary layer, the second auxiliary layer is disposed in contact with the first auxiliary layer, and the second auxiliary layer is disposed in the same layer as at least one metal layer in the array substrate.

Beneficial effects: The present application discloses a display panel, a manufacturing method, and a mobile terminal. The display panel includes an array substrate, a pixel definition layer disposed on the array substrate, a light emitting device layer, and an auxiliary electrode. The pixel definition layer includes a plurality of pixel openings and a plurality of grooves. The light emitting device layer includes an anode layer disposed on the array substrate, light emitting units disposed in the pixel openings, a functional layer disposed on the light emitting units, and a cathode layer disposed on the functional layer. The auxiliary electrode corresponds to the grooves. The auxiliary electrode includes a first auxiliary layer disposed in the same layer as the anode layer, a side wall of the first auxiliary layer is spaced apart from side walls of the grooves to form a first opening, the functional layer is disconnected at the first opening, and the cathode layer covers the first opening and is electrically connected to the side wall of the first auxiliary layer. In the present application, by arranging the first auxiliary layer and the anode layer on the same layer, the same mask can be used to produce the anode layer and the first auxiliary layer. By arranging both the pixel openings and the grooves on the pixel definition layer, the same mask can be used to make the pixel openings and grooves. Therefore, the number of masks is not increased. The first opening is formed by spacing the side wall of the auxiliary electrode from the side wall of the groove. The functional layer is disconnected at the first opening, and the cathode layer continuously covers the first opening. This can realize the overlap between the cathode layer and the first auxiliary layer, thereby reducing a resistance of the cathode layer and improving a voltage drop of the cathode layer.

BRIEF DESCRIPTION OF THE DRAWINGS

The technical solutions and other beneficial effects of the present application will be apparent through a detailed description of the specific embodiments of the present application in conjunction with the accompanying drawings.

DETAILED DESCRIPTION OF ILLUSTRATED EMBODIMENTS

Figure 1:
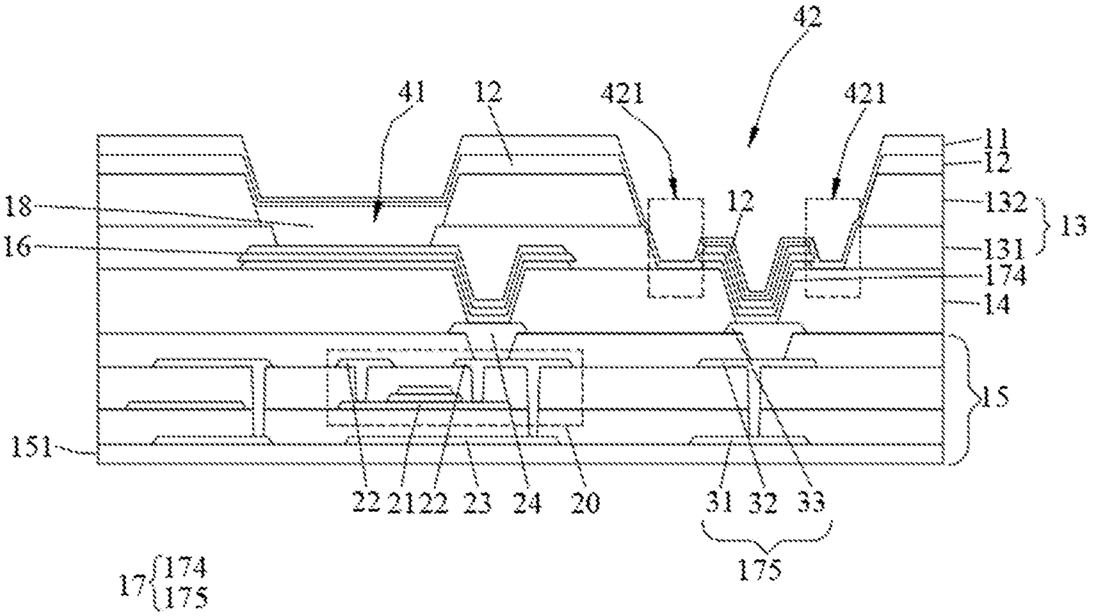
FIG. 1 is a schematic cross-sectional structural diagram of a display panel of the present application.

The technical solutions in the embodiments of the present application will be clearly and completely described below with reference to the accompanying drawings in the embodiments of the present application. Obviously, the described embodiments are only some of the embodiments of the present application, but not all of the embodiments. Based on the embodiments in the present application, all other embodiments obtained by those skilled in the art without making creative efforts fall within the scope of protection of the present application. In addition, it should be understood that the specific embodiments described here are only used to illustrate and explain the present application and are not used to limit the present application. In the present application, unless otherwise specified, the directional words used such as "upper" and "lower" usually refer to the upper and lower positions of the device in actual use or working conditions, specifically the direction of the drawing in the drawings, and "inside" and "outside" refer to the outline of the device.

In OLED display panels, a cathode layer is provided as a whole layer and has a large resistance, causing a voltage drop. Therefore, this issue needs to be improved. In the prior art, the cathode layer is often connected in parallel with an auxiliary electrode to improve a voltage drop. However, the production of the auxiliary electrode requires the use of an additional mask. The cost of the mask is high, resulting in an increase in the cost of the product. How to improve the voltage drop of the cathode layer without adding a mask is one of the technical problems that those skilled in the art urgently need to solve. The present application proposes the following solutions based on the above technical problems.

The present application discloses a display panel. The display panel includes an array substrate 15, a pixel definition layer 13 disposed on the array substrate 15, a light emitting device layer, and an auxiliary electrode 17 corresponding to grooves 42. The pixel definition layer 13 includes a plurality of pixel openings 41 and a plurality of grooves 42. The light emitting device layer includes an anode layer 16 disposed on the array substrate 15, light emitting units 18 disposed in the pixel openings 41, a functional layer 12 disposed on the light emitting units 18, and the cathode layer 11 disposed on the functional layer 12. The auxiliary electrode 17 includes a first auxiliary layer 174 disposed in the same layer as the anode layer 16. A side wall of the first auxiliary layer 174 is spaced apart from a side wall of the groove 42 to form a first opening 421. The functional layer 12 is disconnected at the first opening 421, and the cathode layer 11 covers the first opening 421 and is electrically connected to the side wall of the first auxiliary layer 174.

In the present application, by arranging the first auxiliary layer 174 and the anode layer 16 in the same layer, the anode layer 16 and the first auxiliary layer 174 can be produced using the same mask. By arranging both the pixel opening 41 and the groove 42 on the pixel definition layer 13, the same mask can be used to produce the pixel opening 41 and the groove 42. Therefore, the number of masks is not increased. The first opening 421 is formed by spacing the side wall of the auxiliary electrode 17 and the side wall of the groove 42. The functional layer 12 is interrupted at the first opening 421, and the cathode layer 11 continuously covers the first opening 421. This can realize the overlap between the cathode layer 11 and the first auxiliary layer 174, thereby reducing a resistance of the cathode layer 11 and improving a voltage drop of the cathode layer 11.

Figure 2:
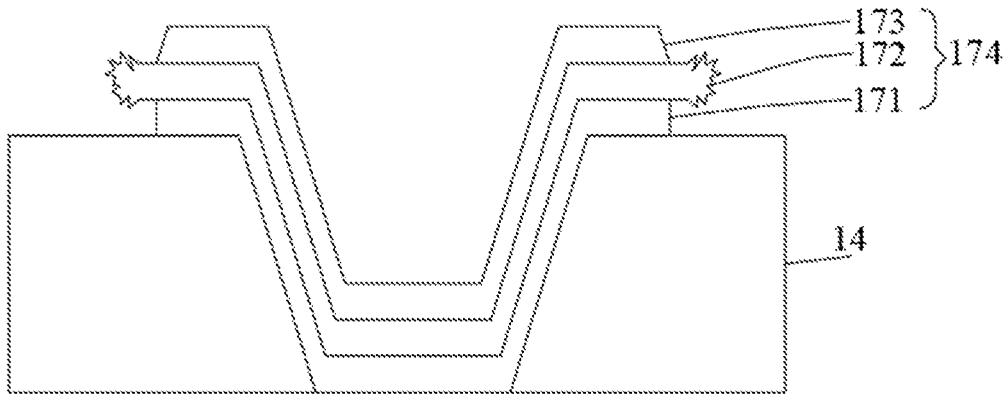
FIG. 2 is an enlarged schematic view of a first auxiliary layer in FIG. 1.
Figure 3:
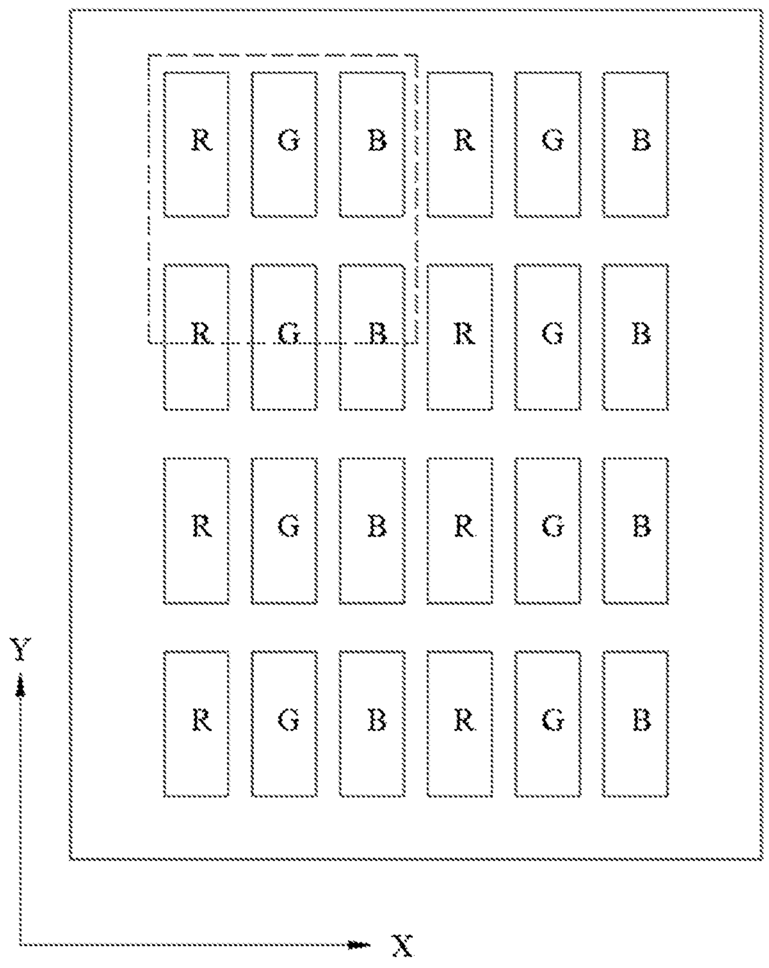
FIG. 3 is a schematic top view of a display panel of the present application.
Figure 4:
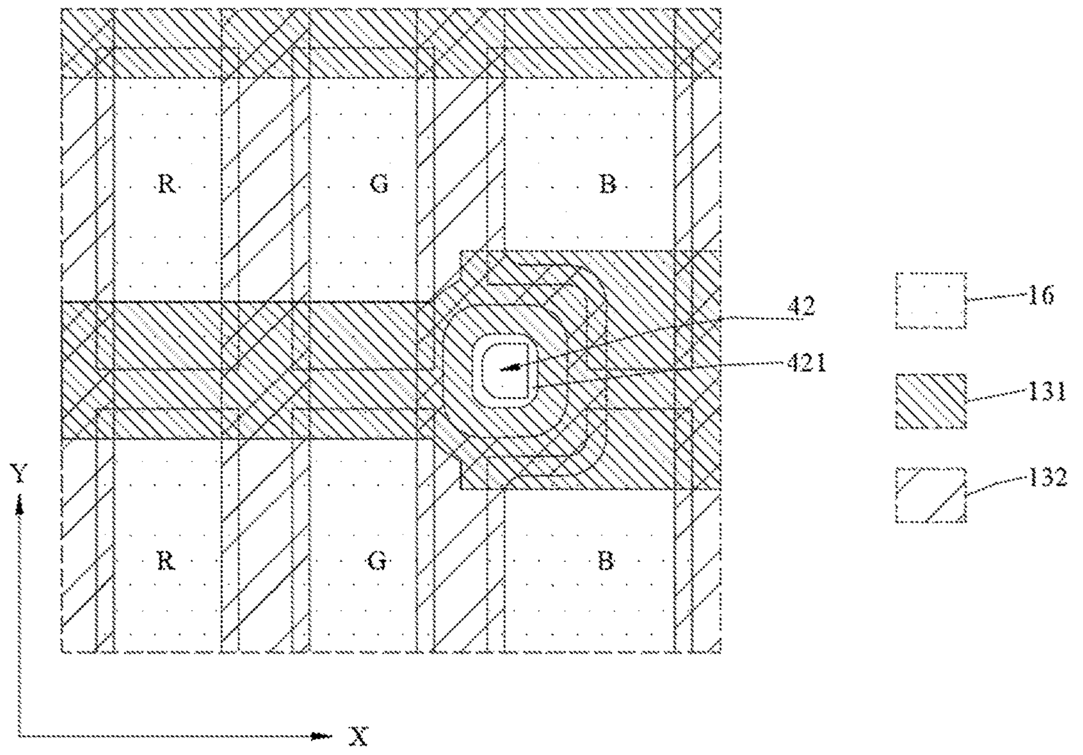
FIG. 4 is a first partial enlarged schematic diagram of a pixel area of a display panel.
Figure 5:
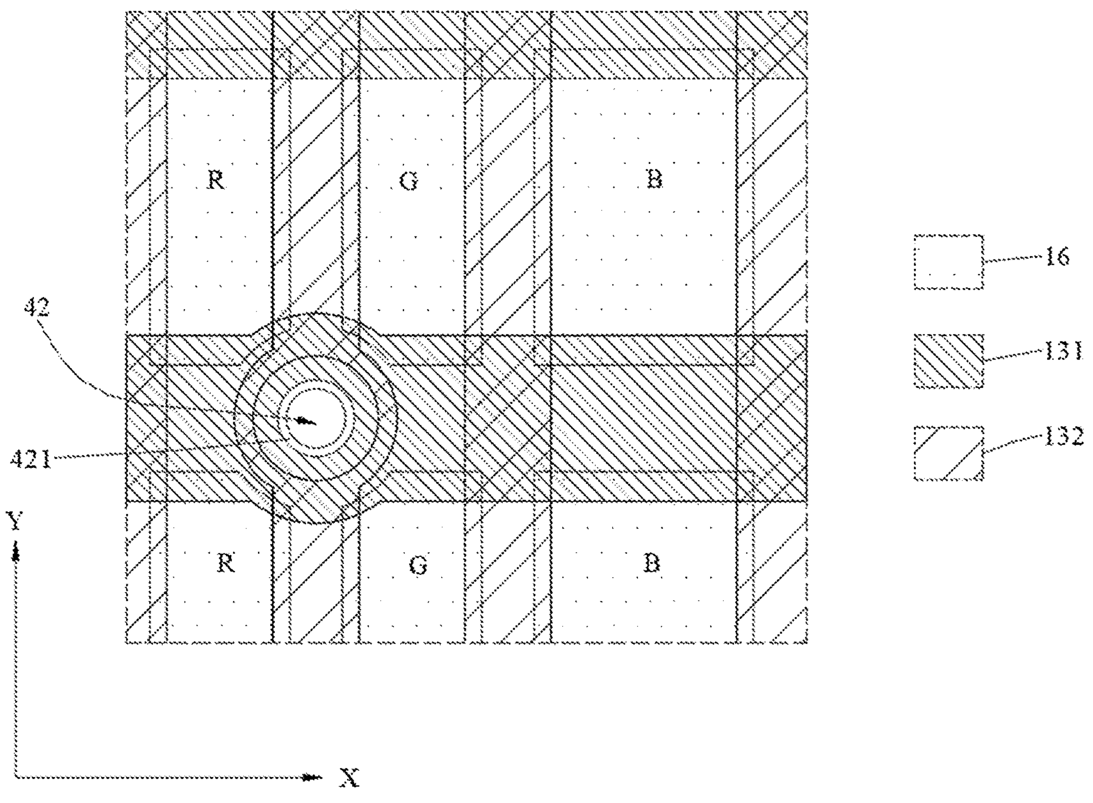
FIG. 5 is a second partially enlarged schematic diagram of a pixel area of a display panel.
Figure 6:
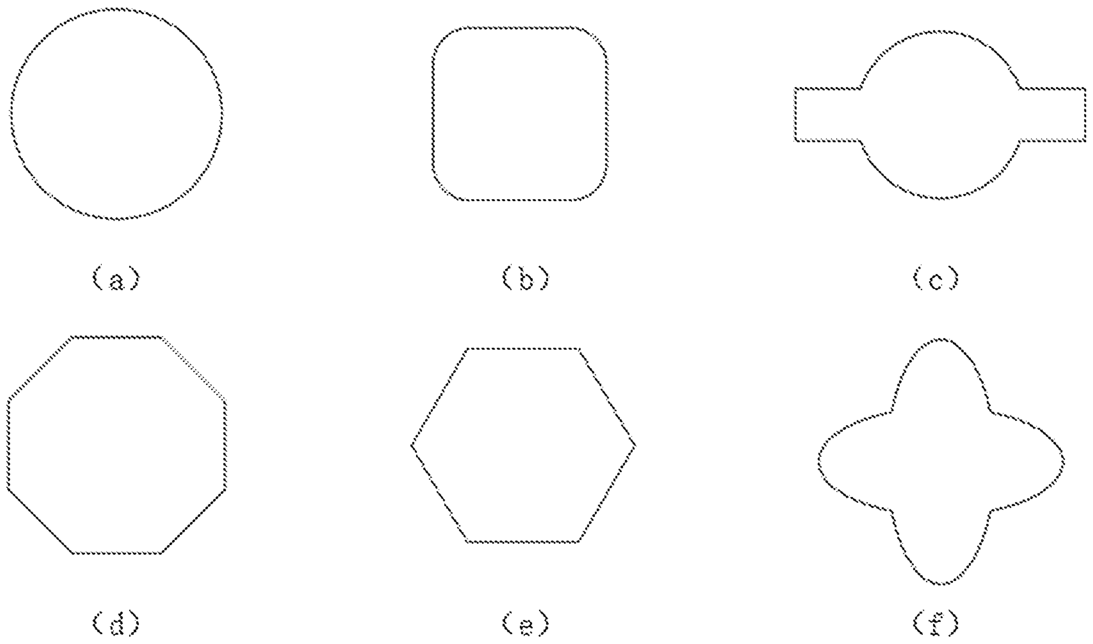
FIG. 6 is a schematic diagram of a shape of a first auxiliary layer in a top view direction of a display panel of the present application.

FIG. 1 is a schematic cross-sectional structural diagram of a display panel of the present application. FIG. 2 is an enlarged schematic view of a first auxiliary layer in FIG. 1. FIG. 3 is a schematic top view of a display panel of the present application. It should be noted that sub-pixels in the figures are only for illustration, and the true relationship between light emitting areas of sub-pixels is not shown. FIG. 4 is a first partial enlarged schematic diagram of a pixel area of a display panel. FIG. 4 can be an enlarged schematic diagram within a virtual frame in FIG. 3. It should be noted, in order to illustrate the positional relationship of red sub-pixels R, green sub-pixels G, blue sub-pixels B, a first pixel definition layer 131, a second pixel definition layer 132, grooves 42, and a first opening 421 in a plan view, the situation between multiple structures that are not visible due to occlusion is not considered. FIG. 5 is a second partially enlarged schematic diagram of a pixel area of a display panel, and its setting is as shown in FIG. 4. FIG. 6 is a schematic diagram of a shape of a first auxiliary layer in a top view direction of a display panel of the present application. FIG. 7 to FIG. 10 are schematic flow diagrams of manufacturing process of a display panel of the present application.

In this embodiment, the display panel may be an OLED panel, a Mini-LED panel, a Micro-LED panel, and etc.

Referring to FIG. 1 to FIG. 2, in a cross-sectional direction of the display panel, the display panel includes an array substrate 15, a light emitting device layer, and etc. The array substrate 15 includes a plurality of thin film transistors 20 distributed in an array, storage capacitors, and etc. The thin film transistor 20 and the storage capacitor constitute a driving circuit of sub-pixels, which is used to drive light emitting units 18 of the display panel to emit light. The light emitting units 18 may be red light emitting units, green light emitting units, or blue light emitting units. By driving the light emitting units 18 of different colors to emit light, a color image can be displayed.

In this embodiment, the thin film transistor 20 of the array substrate 15 may have a top gate structure (as shown in FIG. 1) or a bottom gate structure. The thin film transistor 20 may have a single gate structure (as shown in FIG. 1) or a double gate structure, which is not limited in the present application.

The light emitting device layer includes an anode layer 16, light emitting units 18, a functional layer 12, and a cathode layer 11. The driving circuit on the array substrate 15 is connected to the anode layer 16 to provide data signals to the light emitting device layer. A light shielding layer 23 on the array substrate 15 is connected to the cathode layer 11 to provide a low potential signal to the cathode layer 11. When the driving circuit is working, the anode layer 16 provides holes and the cathode layer 11 provides negative charges. The holes in the anode layer 16 are transported to the light emitting units 18. The negative charges of the cathode layer 11 are transferred to the light emitting units 18 through the functional layer 12. The holes and negative charges recombine in the light emitting units 18 to emit light.

Referring to FIG. 3, in the top view direction of the display panel, the display panel includes a plurality of sub-pixels distributed in an array such as red sub-pixels R, green sub-pixels G, and blue sub-pixels B.

In this embodiment, the light emitting units 18 can be manufactured by evaporation or inkjet printing. When the light emitting units 18 are manufactured by inkjet printing, light emitting material utilization rate is high and the cost is low, which can further reduce the cost of the display panel.

In this embodiment, the pixel definition layer 13 may have only one layer or two layers. When the pixel definition layer 13 is one layer, the pixel definition layer 13 is made around each light-emitting unit 18. The manufacturing process of the light emitting units 18 of the display panel can adopt inkjet printing technology, and the printing method can be an SBS (side by side) solution. When the pixel definition layer 13 has two layers, refer to FIG. 1, FIG. 4, and FIG. 5, the pixel definition layer 13 includes a first pixel definition layer 131 and a second pixel definition layer 132. The first pixel definition layer 131 and the second pixel definition layer 132 are formed around each light emitting unit 18. The manufacturing process of the light emitting units 18 of the display panel can adopt inkjet printing technology, and the printing method can be LB (line bank) solution. The LB printing method uses a strip mask to connect a column of pixels of the same color together and print them uniformly. This can reduce accuracy requirements of inkjet printing and reduce difficulty of the process. This application uses the pixel definition layer 13 as two layers for detailed description.

In this embodiment, refer to FIG. 1, the auxiliary electrode 17 is correspondingly disposed in the groove 42. The groove 42 penetrates the pixel definition layer 13. The side walls of the first auxiliary layer 174 are spaced apart from the side walls of the groove 42 to form the first opening 421. It should be noted that, referring to FIG. 4 and FIG. 5, in the top view direction of the display panel, the first opening 421 is arranged around the groove 42 to form a continuous opening channel.

The material of the first auxiliary layer 174 is the same as the material of the anode layer 16, and is made using the same mask, thereby not increasing the number of masks and saving costs. The groove 42 and the pixel opening 41 can be made using the same mask, thereby not increasing the number of masks and saving costs.

In this embodiment, the functional layer 12 covers the light emitting units 18, the pixel definition layer 13, and the first auxiliary layer 174. The functional layer 12 is disconnected at the first opening 421 to expose the side wall of the first auxiliary layer 174. The functional layer 12 includes, but is not limited to, an electron transport layer. The functional layer 12 can be made by evaporation process or by conventional technical means in this field. It should be noted that the functional layer 12 needs to be disconnected at the first opening 421. This application does not limit the manufacturing process of the functional layer 12.

The cathode layer 11 continuously covers the functional layer 12 and the first opening 421. In the first opening 421, the cathode layer 11 is electrically connected to the side wall of the first auxiliary layer 174.

The technical solution of the present application will now be described with reference to specific embodiments.

In the display panel of the present application, the pixel definition layer 13 includes a first pixel definition layer 131 extending along a first direction X and a second pixel definition layer 132 extending along a second direction Y. The second pixel definition layer 132 is located on a side of the first pixel definition layer 131 away from the array substrate 15. In the top view direction of the display panel, the pixel definition layer 13 is disposed around sub-pixels of the display panel. The sub-pixels include red sub-pixels R, green sub-pixels G, and blue sub-pixels B. The groove 42 is disposed in the overlapping area of the first pixel definition layer 131 and the second pixel definition layer 132, and the groove 42 is disposed between the two blue sub-pixels B.

In this embodiment, refer to FIG. 4, the pixel definition layer 13 includes a first pixel definition layer 131 extending along a first direction X and a second pixel definition layer 132 extending along a second direction Y. The first direction X and the second direction Y are set vertically. The second pixel definition layer 132 is disposed on the first pixel definition layer 131, and a height of the second pixel definition layer 132 is greater than a height of the first pixel definition layer 131. Therefore, the light emitting unit 18 can adopt the LB printing method, further reducing the manufacturing cost of the display panel. It should be noted that when printing the light emitting unit 18 using the LB printing method, a row of sub-pixels of the same color is printed continuously. The first pixel definition layer 131 is located between multiple rows of sub-pixels of the same color. The height of the light emitting unit 18 is greater than the height of the first pixel definition layer 131, so that light emitting materials of multiple rows of sub-pixels of the same color can flow. Therefore, the thickness of the light emitting units 18 in the sub-pixels of the same column and the same color tends to be the same, ensuring display quality. The second pixel definition layer 132 is used to separate two columns of sub-pixels of different colors.

In this embodiment, the sub-pixels of the display panel may include red sub-pixels R, green sub-pixels G, blue sub-pixels B, or other color sub-pixels, which are not limited in this application. It should be noted that the luminous efficiency of the light emitting units 18 of sub-pixels of different colors is different. The luminous efficiency of the blue sub-pixel B is lower than the luminous efficiency of the red sub-pixel R or the green sub-pixel G. Therefore, the light emitting area of the blue sub-pixel B can be set to be larger than the light emitting area of the red sub-pixel R, and the light emitting area of the blue sub-pixel B can be set to be larger than the light emitting area of the green sub-pixel G, thereby balancing the light emission of various colors. efficiency and improve the display quality of the display panel.

Referring to FIG. 4, the area of the blue sub-pixel B is larger than the areas of the red sub-pixel R and the green sub-pixel G. The positions of the red sub-pixel R and the green sub-pixel G can be exchanged. The groove 42 is disposed between the two blue sub-pixels B, and the groove 42 is disposed at the overlap of the first pixel definition layer 131 and the second pixel definition layer 132. The shape of the groove 42 in FIG. 4 is a square with an arc. The groove 42 can also be in other shapes, which is not limited in this application. Within a limited area, the length of the perimeter of the groove 42 in the top view direction of the display panel is large enough to further enhance the overlapping effect between the cathode layer 11 and the first auxiliary layer 174. It should be noted that the width of the first pixel definition layer 131 at the periphery of the groove 42 is larger than the width of the first pixel definition layer 131 at other positions. The width of the second pixel definition layer 132 at the periphery of the groove 42 is greater than the width of the second pixel definition layer 132 at other positions.

It should be noted that the first size of the opening of the groove 42 on the first pixel definition layer 131 is different from the second size of the opening of the groove 42 on the second pixel definition layer 132. The second size is larger than the first size, so that the cathode layer 11 on the side walls of the first pixel definition layer 131 and the second pixel definition layer 132 is continuous.

In the top view direction of the display panel, refer to FIG. 4, the pixel definition layer 13 is arranged around the sub-pixels. The groove 42 is disposed in the overlapping area of the first pixel definition layer 131 and the second pixel definition layer 132, so that the depth of the groove 42 is greater than when there is only one pixel definition layer 13. When the functional layer 12 is produced using an evaporation process, the degree to which the functional layer 12 is disconnected at the first opening 421 is related to the distance between the first opening 421 and the upper surface of the pixel definition layer 13. The greater the distance between the first opening 421 and the upper surface of the pixel definition layer 13, the less the functional layer 12 is deposited per unit area in the first opening 421 and the more discontinuous the functional layer 12 is. Therefore, the more exposed area of the side walls of the first auxiliary layer 174 is, the better the overlapping effect between the cathode layer 11 and the side walls of the first auxiliary layer 174 is.

It should be pointed out that when the pixel definition layer 13 has only one layer, the overlapping of the cathode layer 11 and the first auxiliary layer 174 can still be achieved. When the pixel definition layer 13 includes the first pixel definition layer 131 and the second pixel definition layer 132, the overlapping effect of the cathode layer 11 and the first auxiliary layer 174 is further improved.

In this embodiment, the first pixel definition layer 131 includes a hydrophilic material, and the second pixel definition layer 132 includes a hydrophobic material, thereby reducing the risk of color mixing of sub-pixels of different colors.

In the display panel of the present application, the pixel definition layer 13 includes a first pixel definition layer 131 extending along the first direction X and a second pixel definition layer 132 extending along the second direction Y. The second pixel definition layer 132 is located on a side of the first pixel definition layer 131 away from the array substrate 15. In the top view direction of the display panel, the pixel definition layer 13 is disposed around the sub-pixels of the display panel. The sub-pixels include red sub-pixels R, green sub-pixels G, and blue sub-pixels B. The groove 42 is disposed in the overlapping area of the first pixel definition layer 131 and the second pixel definition layer 132, and the groove 42 is disposed between the red sub-pixel R and the green sub-pixel G.

In this embodiment, please refer to the above embodiment for content that is not described in detail.

In this embodiment, refer to FIG. 5, the light emitting area of the blue sub-pixel B is larger than the light emitting area of the red sub-pixel R, and the light emitting area of the blue sub-pixel B is larger than the light emitting area of the green sub-pixel G. The groove 42 is provided between two red sub-pixels R and two green sub-pixels G. The positions of the red sub-pixel R and the green sub-pixel G can be exchanged. In FIG. 5, the shape of the groove 42 is circular, and the part of the first pixel definition layer 131 surrounding the groove 42 is also circular. The part of the second pixel definition layer 132 arranged around the groove 42 is also circular, thereby ensuring that the thickness of the side walls formed by the first pixel definition layer 131 and the second pixel definition layer 132 and the groove 42 is uniform.

The first size of the opening of the groove 42 on the first pixel definition layer 131 is different from the second size of the opening of the groove 42 on the second pixel definition layer 132. The second size is larger than the first size, so that the cathode layer 11 on the side walls of the first pixel definition layer 131 and the second pixel definition layer 132 is continuous.

In the display panel of this application, referring to FIG. 1 and FIG. 2, the first auxiliary layer 174 includes a stacked first conductive layer 171, a second conductive layer 172, and a third conductive layer 173. The end of the second conductive layer 172 protrudes from the side wall of the first auxiliary layer 174, and the end of the second conductive layer 172 is in contact with the cathode layer 11.

In this embodiment, referring to FIG. 1 and FIG. 2, the second conductive layer 172 is located between the first conductive layer 171 and the third conductive layer 173. The material of the second conductive layer 172 includes metallic silver. The material of the first conductive layer 171 includes one of IZO (indium zinc oxide), ITO (indium tin oxide), or a stack of both. IZO (indium zinc oxide) or ITO (indium tin oxide) can increase the adhesion between the first conductive layer 171 and other metal layers and reduce contact resistance. The material of the third conductive layer 173 includes one of IZO (indium zinc oxide), ITO (indium tin oxide), or a stack of both. The third conductive layer 173 is disposed on the side of the second conductive layer 172 away from the array substrate 15. The end of the second conductive layer 172 protrudes from the side wall of the first auxiliary layer 174. That is to say, the side walls of the second conductive layer 172 exceed the side walls of the first conductive layer 171 and the side walls of the second conductive layer 172. The end of the second conductive layer 172 has an uneven surface. Therefore, the end of the second conductive layer 172 has a larger contact area and can achieve a better overlapping effect with the cathode layer 11. In addition, protruding end parts of the second conductive layer 172 can also prevent the second conductive layer 172 from being covered by the functional layer 12, thereby increasing the probability of overlapping between the second conductive layer 172 and the cathode layer 11.

Further, in the cross-sectional view of the display panel, referring to FIG. 3, the length dimension of the second conductive layer 172 protruding from the first conductive layer 171 is several hundred nanometers. The thickness of the functional layer 12 at the first opening 421 is several tens of nanometers. The length dimension of the second conductive layer 172 protruding from the first conductive layer 171 is greater than the thickness dimension of the functional layer 12, therefore, the functional layer 12 cannot cover the second conductive layer 172. This ensures that the second conductive layer 172 is exposed outside the functional layer 12, thereby ensuring that the second conductive layer 172 and the cathode layer 11 are overlapped.

In this embodiment, the material of the anode layer 16 is the same as the material of the first auxiliary layer 174. That is, the anode layer 16 may also include a first conductive layer 171, a second conductive layer 172, and a third conductive layer 173. The third conductive layer 173 is disposed on the side of the second conductive layer 172 away from the array substrate 15. In the anode layer 16, the second conductive layer 172 may be metallic silver. The metallic silver can reflect the light emitted from the light emitting unit 18, reduce light leakage, and block downward transmission of light. This improves light utilization and increases the display brightness of the display panel. In the anode layer 16, the material of the first conductive layer 171 includes one of IZO (indium zinc oxide), ITO (indium tin oxide), or a stack of both. IZO (indium zinc oxide) or ITO (indium tin oxide) can increase the adhesion between the first conductive layer 171 and other metal layers and reduce contact resistance. In the anode layer 16, the material of the third conductive layer 173 includes one of IZO (indium zinc oxide), ITO (indium tin oxide), or a stack of both. IZO (indium zinc oxide) matches the work function of the film layer of the light emitting unit 18 to achieve better light emitting effects.

In this embodiment, the anode layer 16 and the first auxiliary layer 174 are made of the same material, so that a mask can be shared, thereby saving costs.

In the display panel of the present application, the functional layer 12 covers the cathode layer 11, and the functional layer 12 is disconnected at the side wall of the first auxiliary layer 174. The first opening 421 surrounds the groove 42.

In this embodiment, referring to FIG. 1, the functional layer 12 is disconnected at the side wall of the first auxiliary layer 174. The functional layer 12 can be made by evaporation process. The groove 42 has a certain height, so that the functional layer 12 is disconnected at the side walls of the first auxiliary layer 174.

Referring to FIG. 4 and FIG. 5, in the top view direction of the display panel, the first opening 421 surrounds the groove 42 to form a connected opening channel.

In the display panel of the present application, in the top view direction of the display panel, the shape of the first auxiliary layer 174 includes a circle or a polygon.

In all embodiments of the present application, in the top view direction of the display panel, referring to FIG. 6, the shape of the first auxiliary layer 174 includes circles, polygons, etc. Polygons can be regular polygons or irregular polygons including straight lines and arcs. For example, the shape of the first auxiliary layer 174 includes but is not limited to a circle (a), a square with rounded corners (b), a rectangle with arcs (c), a regular octagon (d), and a regular hexagon (e), cross shape with rounded corners (f), etc. It should be noted that the shape of the first auxiliary layer 174 can increase the perimeter of the pattern of the first auxiliary layer 174 as much as possible within a limited space area. This increases the probability that the side walls of the first auxiliary layer 174 overlap the cathode layer 11. This application does not limit the shape of the first auxiliary layer 174.

Further, the groove 42 is matched with the first auxiliary layer 174. That is to say, the shapes of the grooves 42 and the first auxiliary layer 174 are similar, and the grooves 42 and the first auxiliary layer 174 are arranged at uniform intervals.

In the display panel of the present application, the auxiliary electrode 17 further includes a second auxiliary layer 175. The second auxiliary layer 175 is disposed in contact with the first auxiliary layer 174. The second auxiliary layer 175 is provided in the same layer as at least one metal layer in the array substrate 15.

In this embodiment, referring to FIG. 1, the array substrate 15 further includes a plurality of thin film transistors 20 distributed in an array. A light shielding layer 23 is provided below the thin film transistor 20 for blocking light emitted from below. This prevents light from causing electrical degradation of the active layer 21 of the thin film transistor 20. A passivation layer and a planarization layer 14 are provided on a source-drain layer 22. A connection part 24 may also be provided between the source-drain layer 22 and the anode layer 16, and the connection part 24 penetrates part of the passivation layer and the planarization layer 14.

The source-drain layer 22, the light shielding layer 23, and the connection part 24 are all made of metal. The metal layer in this embodiment can be any layer among the source and drain layer 22, the light shielding layer 23, and the connection part 24. The second auxiliary layer 175 is disposed on the same layer as at least one metal layer in the array substrate 15. That is to say, the second auxiliary layer 175 may be disposed in the same layer as at least one metal layer of the thin film transistor 20. For example, the second auxiliary layer 175 may include at least one of the first metal part 31, the second metal part 32, and the third metal part 33. The first metal part 31 may be provided on the same layer as the light shielding layer 23. The second metal part 32 may be disposed on the same layer as the source-drain layer 22, and the third metal part 33 may be disposed on the same layer as the connection part 24.

Based on the same inventive concept, this application also provides a method for manufacturing the above-mentioned display panel. Referring to FIG. 7 to FIG. 10, the manufacturing method includes:

S1: Providing a substrate 151 and forming a light shielding layer 23 and a first metal part 31 on the substrate 151;

S2: Forming a buffer layer on the light shielding layer 23 and forming a semiconductor layer on the buffer layer;

S3: Forming a gate insulating layer on the semiconductor layer and forming a gate on the gate insulating layer;

S4: Forming an interlayer insulating layer on the gate and using a preset process to form a plurality of through holes, wherein the through holes penetrate the interlayer insulating layer and expose the light shielding layer 23 and the first metal part 31;

S5: Forming a source-drain layer 22 and a second metal part 32 on the interlayer insulating layer, wherein the source-drain layer 22 and the second metal part 32 fill a plurality of the through holes;

S6: Forming a passivation layer on the source-drain layer 22 and using the preset process to open an opening on the passivation layer corresponding to the source-drain layer 22 and the second metal part 32 to expose the source-drain layer 22 and the second metal part 32;

S7: Forming a connection part 24 and a third metal part 33 in the opening on the passivation layer;

S8: Forming a planarization layer 14 on the connection part 24 and the third metal part 33 and using the preset process to open an opening on the planarization layer 14 corresponding to the connection part 24 and the third metal part 33 to expose the connection part 24 and the third metal part 33;

S9: Forming an anode layer 16 and a first auxiliary layer 174 on the planarization layer 14;

S10: Forming a pixel definition layer 13 on the anode layer 16 and the first auxiliary layer 174, forming a plurality of pixel openings 41 and a plurality of grooves 42 on the pixel definition layer 13, forming light emitting units 18 in the pixel openings, wherein the grooves 42 correspond to the auxiliary electrode 17, and the side wall of the first auxiliary layer 174 is spaced apart from side walls of the grooves 42 to form a first opening 421;

S11: Forming a functional layer 12 on the pixel definition layer 13, wherein the functional layer 12 is disconnected at the first opening 421; and

S12: Forming a cathode layer 11 on the functional layer 12, wherein the cathode layer 11 covers the first opening 421 and is electrically connected to the side wall of the first auxiliary layer 174.

In this embodiment, the metal layer can be formed using a physical vapor deposition (physical vapor deposition, PVD) film forming process. The semiconductor layer can be produced using a chemical vapor deposition (chemical vapor deposition, CVD) film forming process. Other film forming processes can also be used for film formation, and this application does not limit this.

In this embodiment, the patterning process includes photoresist coating, exposure, development, etching process, etc., which is not limited in this application. In this application, the method of making a metal layer or a semiconductor layer is that: First, a film forming process is used to make a layer of film, and then a patterning process is used to form a pattern to obtain the required structure. Those skilled in the art should know the implementation method, and this application does not limit this.

Figure 7:
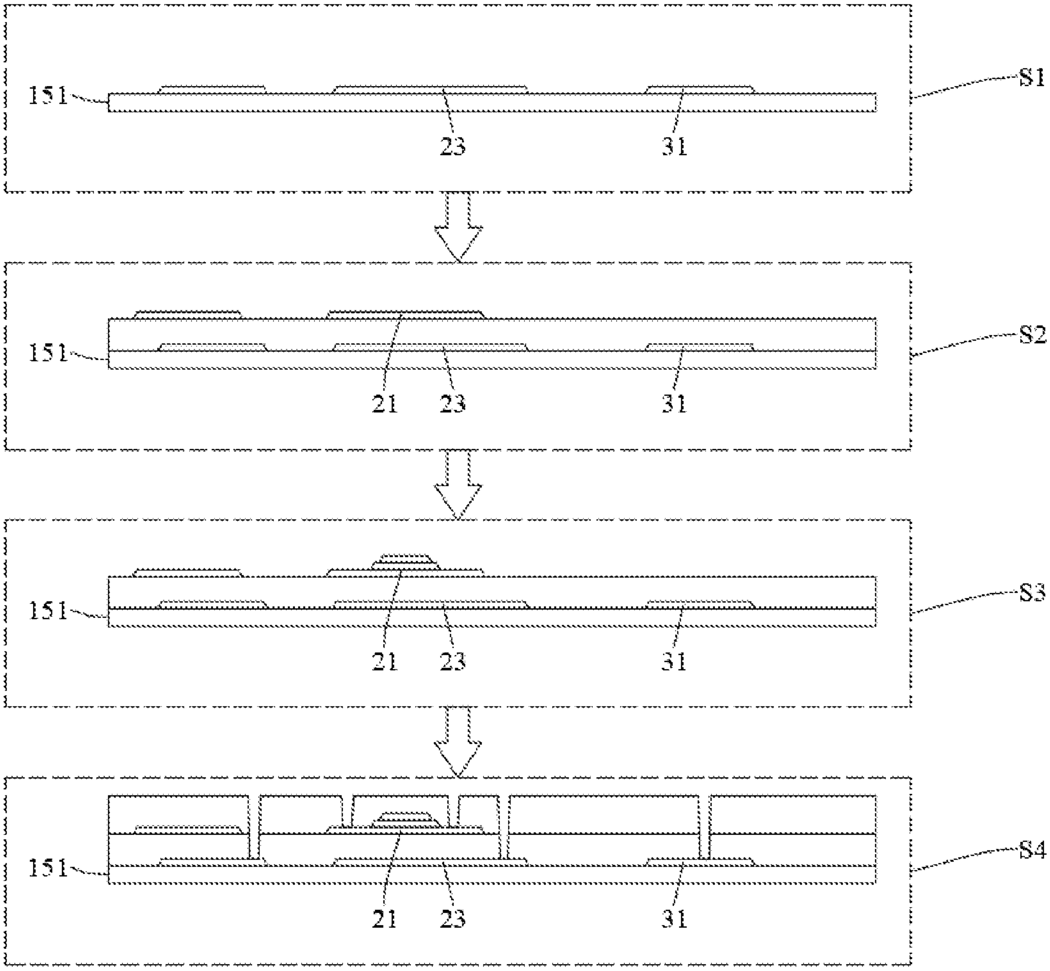
FIG. 7 to FIG. 10 are schematic flow diagrams of manufacturing process of a display panel of the present application.

In this embodiment, referring to FIG. 7, in S1, the substrate 151 may be a rigid substrate or a flexible substrate. The rigid substrate basically includes glass, etc., and the flexible substrate includes polyimide, etc. The light shielding layer 23 and the first metal part 31 are made of the same material, including one or more alloys of molybdenum, titanium, copper, manganese, etc. The method of manufacturing the light shielding layer 23 and the first metal part 31 includes forming a metal layer using a film forming process, and then using a patterning process to obtain the light shielding layer 23 and the first metal part 31. By manufacturing the light shielding layer 23 and the first metal part 31 in the same process, the light shielding layer 23 and the first metal part 31 can share a mask. Therefore, there is no need to add a mask, saving production costs.

In S2, the buffer layer may be one of silicon oxide, silicon nitride, or a stack of both. The semiconductor layer can be a metal oxide, including IGZO (indium gallium zinc oxide), IZTO (indium zinc tin oxide), IGZTO (indium gallium zinc tin oxide), etc. A buffer layer is formed on the light shielding layer 23 and the first metal part 31 using a film forming process. A film forming process is used to form a semiconductor layer on the buffer layer, and a patterning process is used to process the semiconductor layer to obtain the active layer 21.

In S3, the material of the gate insulating layer includes one of silicon oxide, silicon nitride, or a stack of both. The material of the gate electrode includes one or more alloys of molybdenum, titanium, and copper. After the gate electrode is formed using a film forming process and a patterning process, gate self-alignment can be used to etch the gate insulating layer. Only the gate insulating layer under the gate is retained, and the rest of the gate insulating layer is etched away. Then, the entire surface is conductorized, and the active layer 21 not covered by the gate electrode and the gate insulating layer forms an N+ conductor layer. The active layer 21 covered by the gate insulating layer maintains semiconductor characteristics and serves as a channel part.

In S4, the material of the interlayer insulating layer includes one of silicon oxide, silicon nitride, or a stack of both. Preset processes include patterning processes, etc. For example, yellow light is used to define multiple through holes, and then the through holes are etched.

Figure 8:
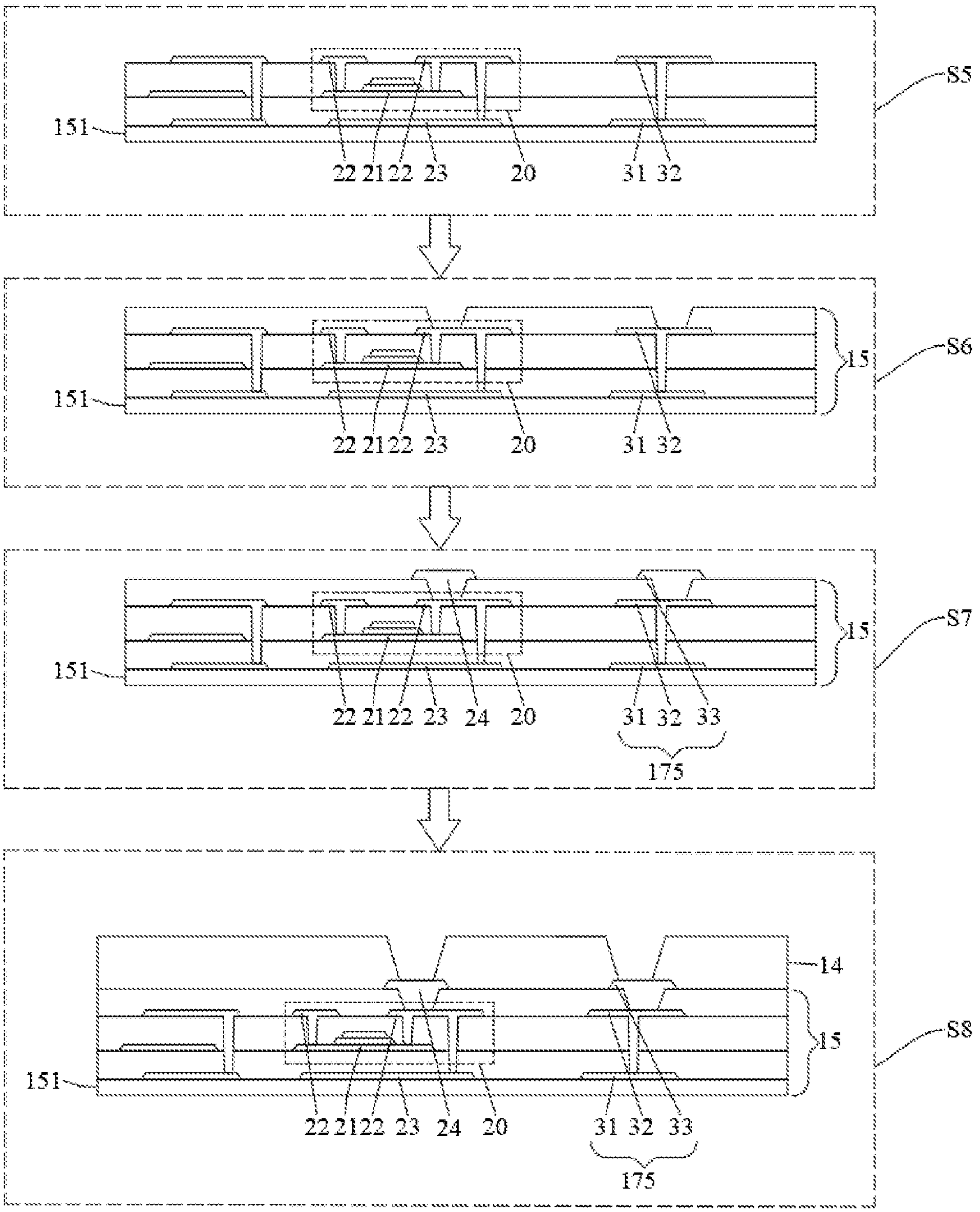

Referring to FIG. 8 in S5, the material of the source-drain layer 22 is composed of two metal layers of molybdenum-titanium alloy and copper, or three-layer metal of molybdenum-titanium alloy, copper, and molybdenum-titanium alloy. The material of the second metal part 32 is composed of two metal layers of molybdenum-titanium alloy and copper, or three-layer metal of molybdenum-titanium alloy, copper, and molybdenum-titanium alloy. It should be noted that the second metal part 32 has the same structure as the source-drain layer 22. That is to say, when the source-drain layer 22 includes two layers of metal, the second metal part 32 also includes two layers of metal. When the source-drain layer 22 includes three layers of metal, the second metal part 32 also includes three layers of metal. By manufacturing the source-drain layer 22 and the second metal part 32 in the same process, one mask can be shared, thereby saving costs.

In S6, the material of the passivation layer includes one of silicon oxide, silicon nitride, or a stack of both. The passivation layer is formed above the source-drain layer 22 and the second metal part 32 using a film forming process, and then a patterning process is used to form through holes corresponding to the source-drain layer 22 and the second metal part 32.

In S7, when the source-drain layer 22 and the second metal part 32 include two layers of metal, the connection part 24 and the third metal part 33 are formed on the passivation layer. When the source-drain layer 22 and the second metal part 32 include three layers of metal, the connection part 24 and the third metal part 33 may be omitted. It should be noted that the source-drain layer 22 and the second metal part 32 in FIG. 8 include two layers of metal.

In S8, the planarization layer 14 is produced and patterned. The planarization layer 14 can be made of only one or two layers of materials. The material of the planarization layer 14 includes organic photoresist and the like.

Figure 9:
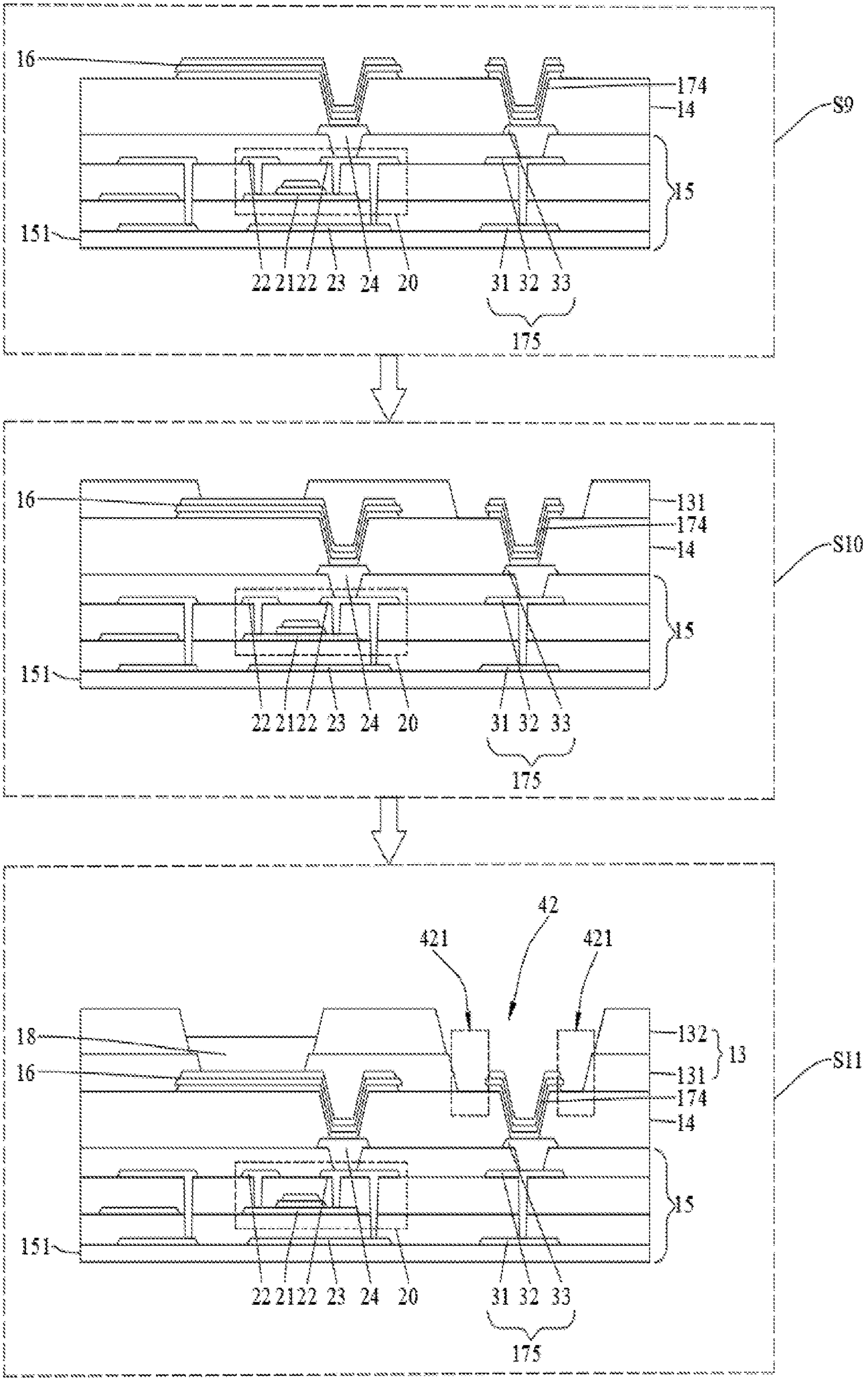

Referring to FIG. 9, in S9, the anode layer 16 and the first auxiliary layer 174 are produced using a PVD film forming process. The material of the first auxiliary layer 174 is the same as that of the anode layer 16 and is made using the same mask, thereby not increasing the number of masks and saving costs.

The first conductive layer 171, the second conductive layer 172, and the third conductive layer 173 are sequentially formed using a film forming process, and then a patterning process is performed to form the anode layer 16 and the first auxiliary layer 174.

The material of the second conductive layer 172 includes metallic silver. The material of the first conductive layer 171 includes one of IZO (indium zinc oxide), ITO (indium tin oxide), or a stack of both. IZO (indium zinc oxide) or ITO (indium tin oxide) can increase the adhesion between the first conductive layer 171 and other metal layers and reduce contact resistance. The material of the third conductive layer 173 includes one of IZO (indium zinc oxide), ITO (indium tin oxide), or a stack of both. The end of the second conductive layer 172 protrudes from the side wall of the first auxiliary layer 174. That is to say, the side walls of the second conductive layer 172 exceed the side walls of the first conductive layer 171 and the side walls of the second conductive layer 172. The end of the second conductive layer 172 has an uneven surface. Therefore, the end of the second conductive layer 172 has a larger contact area and can achieve a better overlapping effect with the cathode layer 11. In addition, protruding end parts of the second conductive layer 172 can also prevent the second conductive layer 172 from being covered by the functional layer 12, thereby increasing the probability of overlapping between the second conductive layer 172 and the cathode layer 11. The material of the first auxiliary layer 174 is the same as that of the anode layer 16 and is made using the same mask, thereby not increasing the number of masks and saving costs. The groove 42 and the pixel opening 41 can be made using the same mask, thereby not increasing the number of masks and saving costs.

In S10, the pixel definition layer 13 may include a first pixel definition layer 131 and a second pixel definition layer 132. The first pixel definition layer 131 includes a hydrophilic material, and the second pixel definition layer 132 includes a hydrophobic material, thereby reducing the risk of color mixing of sub-pixels of different colors.

A patterning process is used to form a plurality of pixel openings 41 and a plurality of grooves 42 on the pixel definition layer 13. The groove 42 penetrates the pixel definition layer 13 and exposes the side walls of the first auxiliary layer 174. The side walls of the first auxiliary layer 174 are spaced apart from the side walls of the groove 42 to form the first opening 421. The first opening 421 is provided along the side wall of the groove 42. The groove 42 and the pixel opening 41 can be made using the same mask, thereby not increasing the number of masks and saving costs. Inkjet printing can be used to manufacture the light emitting unit 18 in the pixel opening 41, for example, LB printing can be used, thereby reducing the manufacturing cost of the display panel.

In S11, an evaporation process is used to form the functional layer 12 on the pixel definition layer 13, and the functional layer 12 covers the display area of the display panel. Since the second conductive layer 172 is protruded, the functional layer 12 may be disconnected at the first opening 421.

Figure 10:
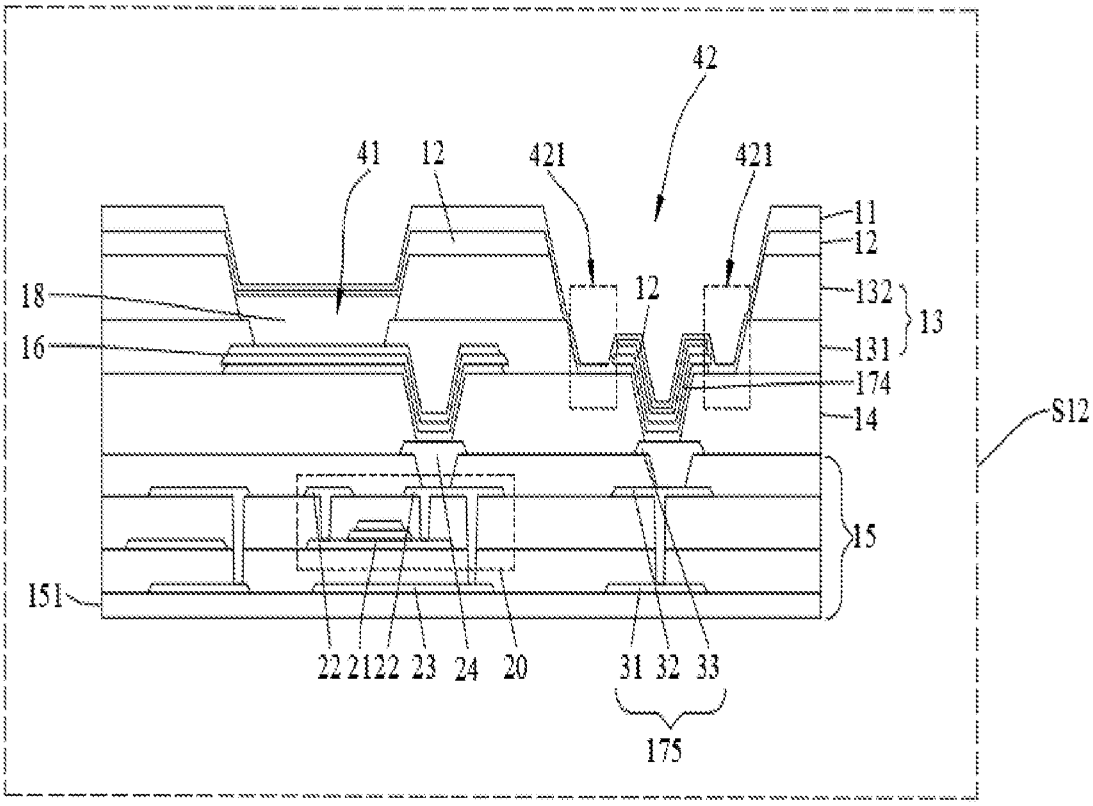

Referring to FIG. 10, in S12, the magnetron sputtering process or evaporation process is used. By adjusting the evaporation angle of the evaporation process, the continuity of the cathode layer 11 can be achieved while ensuring the electrical connection between the cathode layer 11 and the side wall of the first auxiliary layer 174.

In this embodiment, the first metal part 31, the second metal part 32, and the third metal part 33 are electrically connected. A low voltage signal may be provided to the cathode layer 11 through the first metal part 31.

In the manufacturing method of the display panel, for matters not described in detail, please refer to the embodiments of the display panel provided in this application.

This application also provides a mobile terminal, including the above display panel.

In this embodiment, the mobile terminal may be: a mobile phone, a tablet computer, a television, a monitor, a notebook computer, a digital photo frame, a navigator, or any other product or component with a display function.

In the above embodiments, each embodiment is described with its own emphasis. For parts that are not described in detail in a certain embodiment, please refer to the relevant descriptions of other embodiments.

The above has introduced in detail a display panel, a manufacturing method and a mobile terminal provided by embodiments of the present application. This article uses specific examples to illustrate the principles and implementation methods of this application. The description of the above embodiments is only used to help understand the technical solution and its core idea of the present application. Those of ordinary skill in the art should understand that they can still modify the technical solutions described in the foregoing embodiments or make equivalent substitutions for some of the technical features. However, these modifications or substitutions do not cause the essence of the corresponding technical solutions to depart from the scope of the technical solutions of the embodiments of the present application.

What is claimed is:

1. A display panel, comprising:

an array substrate;

a pixel definition layer disposed on the array substrate, wherein the pixel definition layer comprises a plurality of pixel openings and a plurality of grooves;

a light emitting device layer comprising a plurality of anode layers disposed on the array substrate, light emitting units disposed in the pixel openings, a functional layer disposed on the light emitting units, and a cathode layer disposed on the functional layer; and a plurality of auxiliary electrodes respectively corresponding to the grooves;

wherein the auxiliary electrode comprises a first auxiliary layer disposed in the same layer as the anode layer, a side wall of the first auxiliary layer is spaced apart from a side wall of the groove to form a first opening, the functional layer extends along the first auxiliary layer in the groove and is disconnected over the first opening, and the cathode layer covers the first opening and is electrically connected to the side wall of the first auxiliary layer.

2. The display panel according to claim 1, wherein the pixel definition layer comprises:

a first pixel definition layer extending along a first direction;

a second pixel definition layer extending along a second direction, wherein the second pixel definition layer is located on a side of the first pixel definition layer away from the array substrate;

in a top view direction of the display panel, the pixel definition layer is arranged around sub-pixels of the display panel, the sub-pixels comprise red sub-pixels, green sub-pixels, and blue sub-pixels, the grooves are disposed in an overlapping area of the first pixel definition layer and the second pixel definition layer, and each of the grooves is disposed between the two blue sub-pixels.

3. The display panel according to claim 1, wherein the pixel definition layer comprises:

a first pixel definition layer extending along a first direction;

a second pixel definition layer extending along a second direction, wherein the second pixel definition layer is located on a side of the first pixel definition layer away from the array substrate;

in a top view direction of the display panel, the pixel definition layer is arranged around sub-pixels of the display panel, the sub-pixels comprise red sub-pixels, green sub-pixels, and blue sub-pixels, the grooves are disposed in an overlapping area of the first pixel definition layer and the second pixel definition layer, and each of the grooves are disposed between each of the red sub-pixels and each of the green sub-pixels.

4. The display panel according to claim 1, wherein the first auxiliary layer comprises a first conductive layer, a second conductive layer, and a third conductive layer stacked on each other;

wherein an end of the second conductive layer protrudes from the side wall of the first auxiliary layer, and the end of the second conductive layer is in contact with the cathode layer.

5. The display panel according to claim 4, wherein the end of the second conductive layer has an uneven surface, and a material of the second conductive layer comprises metallic silver.

6. The display panel according to claim 1, wherein the functional layer covers the first auxiliary layer, the functional layer is interrupted at the side wall of the first auxiliary layer, and the first opening surrounds the first auxiliary layer.

7. The display panel according to claim 1, wherein in a top view direction of the display panel, a shape of the first auxiliary layer comprises a circle or a polygon.

8. The display panel according to claim 1, wherein the auxiliary electrode further comprises a second auxiliary layer, the second auxiliary layer is disposed in contact with the first auxiliary layer, and the second auxiliary layer is disposed in the same layer as at least one metal layer in the array substrate.

9. A method of manufacturing a display panel, comprising:

providing a substrate and forming a light shielding layer and a first metal part on the substrate;

forming a buffer layer on the light shielding layer and forming a semiconductor layer on the buffer layer;

forming a gate insulating layer on the semiconductor layer and forming a gate on the gate insulating layer;

forming an interlayer insulating layer on the gate and using a preset process to form a plurality of through holes, wherein the through holes penetrate the interlayer insulating layer and expose the light shielding layer and the first metal part;

forming a source-drain layer and a second metal part on the interlayer insulating layer, wherein the source-drain layer and the second metal part fill a plurality of the through holes;

forming a passivation layer on the source-drain layer and using the preset process to open an opening on the passivation layer corresponding to the source-drain layer and the second metal part to expose the source-drain layer and the second metal part;

forming a connection part and a third metal part in the opening on the passivation layer;

forming a planarization layer on the connection part and the third metal part and using the preset process to open an opening on the planarization layer corresponding to the connection part and the third metal part to expose the connection part and the third metal part;

forming a plurality of anode layers and a plurality of first auxiliary layers on the planarization layer;

forming a pixel definition layer on the anode layers and the first auxiliary layers, forming a plurality of pixel openings and a plurality of grooves on the pixel definition layer, forming light emitting units in the pixel openings, wherein the grooves respectively correspond to the first auxiliary layers, and a side wall of the first auxiliary layer is spaced apart from a side wall of the groove to form a first opening;

forming a functional layer on the pixel definition layer, wherein the functional layer extends along the first auxiliary layer in the groove and is disconnected over the first opening; and forming a cathode layer on the functional layer, wherein the cathode layer covers the first opening and is electrically connected to the side wall of the first auxiliary layer.

10. The method of manufacturing the display panel according to claim 9, further comprising using inkjet printing to form the light emitting units.

11. A mobile terminal, comprising:

a display panel, comprising:

an array substrate;

a pixel definition layer disposed on the array substrate, wherein the pixel definition layer comprises a plurality of pixel openings and a plurality of grooves;

a light emitting device layer comprising a plurality of anode layer disposed on the array substrate, light emitting units disposed in the pixel openings, a functional layer disposed on the light emitting units, and a cathode layer disposed on the functional layer; and a plurality of auxiliary electrode respectively corresponding to the grooves;

wherein the auxiliary electrode comprises a first auxiliary layer disposed in the same layer as the anode layer, a side wall of the first auxiliary layer is spaced apart from a side wall of the groove to form a first opening, the functional layer extends along the first auxiliary layer in the groove and is disconnected over the first opening, and the cathode layer covers the first opening and is electrically connected to the side wall of the first auxiliary layer.

12. The mobile terminal according to claim 11, wherein the pixel definition layer comprises:

a first pixel definition layer extending along a first direction;

a second pixel definition layer extending along a second direction, wherein the second pixel definition layer is located on a side of the first pixel definition layer away from the array substrate;

in a top view direction of the display panel, the pixel definition layer is arranged around sub-pixels of the display panel, the sub-pixels comprise red sub-pixels, green sub-pixels, and blue sub-pixels, the grooves are disposed in an overlapping area of the first pixel definition layer and the second pixel definition layer, and each of the grooves is disposed between the two blue sub-pixels.

13. The mobile terminal according to claim 11, wherein the pixel definition layer comprises:

a first pixel definition layer extending along a first direction;

a second pixel definition layer extending along a second direction, wherein the second pixel definition layer is located on a side of the first pixel definition layer away from the array substrate;

in a top view direction of the display panel, the pixel definition layer is arranged around sub-pixels of the display panel, the sub-pixels comprise red sub-pixels, green sub-pixels, and blue sub-pixels, the grooves are disposed in an overlapping area of the first pixel definition layer and the second pixel definition layer, and each of the grooves are disposed between each of the red sub-pixels and each of the green sub-pixels.

14. The mobile terminal according to claim 13, wherein a light emitting area of the blue sub-pixels is greater than a light emitting area of the red sub-pixels.

15. The mobile terminal according to claim 13, wherein a light emitting area of the blue sub-pixels is greater than a light emitting area of the green sub-pixels.

16. The mobile terminal according to claim 11, wherein the first auxiliary layer comprises a first conductive layer, a second conductive layer, and a third conductive layer stacked on each other;

wherein an end of the second conductive layer protrudes from the side wall of the first auxiliary layer, and the end of the second conductive layer is in contact with the cathode layer.

17. The mobile terminal according to claim 16, wherein the end of the second conductive layer has an uneven surface, and a material of the second conductive layer comprises metallic silver.

18. The mobile terminal according to claim 11, wherein the functional layer covers the first auxiliary layer, the functional layer is interrupted at the side wall of the first auxiliary layer, and the first opening surrounds the first auxiliary layer.

19. The mobile terminal according to claim 11, wherein in a top view direction of the display panel, a shape of the first auxiliary layer comprises a circle or a polygon.

20. The mobile terminal according to claim 11, wherein the auxiliary electrode further comprises a second auxiliary layer, the second auxiliary layer is disposed in contact with the first auxiliary layer, and the second auxiliary layer is disposed in the same layer as at least one metal layer in the array substrate.

* * * * *